(12) United States Patent
Preisach

(10) Patent No.: US 7,084,694 B2
(45) Date of Patent: Aug. 1, 2006

(54) SWITCHING CIRCUIT FOR SWITCHING CONSTANT CURRENT SOURCE USING MOS TRANSISTOR

(75) Inventor: Helmut Preisach, Besigheim (DE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/752,023

(22) Filed: Jan. 7, 2004

(65) Prior Publication Data
US 2004/0150460 A1 Aug. 5, 2004

(30) Foreign Application Priority Data
Feb. 5, 2003 (EP) .................................. 03360015

(51) Int. Cl.
*H03K 17/60* (2006.01)
(52) U.S. Cl. ........................... 327/433; 326/64; 326/84
(58) Field of Classification Search ........ 327/108–112, 327/65–67, 89, 563, 433; 330/252, 253; 326/64, 84
See application file for complete search history.

(56) References Cited

U.S. PATENT DOCUMENTS

| | | | | |
|---|---|---|---|---|
| 5,373,469 A | * | 12/1994 | Akioka et al. | 365/189.05 |
| 5,396,113 A | * | 3/1995 | Park et al. | 327/543 |
| 5,614,844 A | * | 3/1997 | Sasaki et al. | 326/84 |
| 5,877,642 A | * | 3/1999 | Takahashi | 327/207 |
| 5,900,745 A | * | 5/1999 | Takahashi | 326/64 |
| 5,917,360 A | * | 6/1999 | Yasutake | 327/387 |
| 6,339,344 B1 | * | 1/2002 | Sakata et al. | 326/83 |
| 6,342,793 B1 | * | 1/2002 | Lukes et al. | 326/66 |
| 6,411,159 B1 | | 6/2002 | Callahan, Jr. | |
| 6,462,852 B1 | * | 10/2002 | Paschal et al. | 398/202 |

OTHER PUBLICATIONS

Patent Abstracts of Japan, vol. 1995, No. 03, Apr. 28, 1995 & JP 06338780 A (NEC Corp), Dec. 6, 1994.

* cited by examiner

*Primary Examiner*—Kenneth B. Wells
(74) *Attorney, Agent, or Firm*—Sughrue Mion, PLLC

(57) ABSTRACT

A basic switching circuit combines CMOS and bipolar technique on SiGe basis and operates at a low operating voltage of only slightly more than 2V. To achieve this low operating voltage, switching operation of the circuit is effected by switching a constant current source of the switching circuit on or off using MOS transistors. In addition, the constant current source is implemented using a MOS transistor rather than a bipolar transistor, which basically acts as a controllable resistor. Moreover, the logic levels in the output signal are accurately controlled using a constant current source that is controlled by an operational amplifier and a resistor voltage divider at the output to pull the voltage level down by an amount that corresponds to the logical levels.

18 Claims, 2 Drawing Sheets

SWITCHING CIRCUIT FOR SWITCHING CONSTANT CURRENT SOURCE USING MOS TRANSISTOR

The invention is based on a priority application EP 03360015.6 which is hereby incorporated by reference.

FIELD OF THE INVENTION

The present invention relates to the field of telecommunications and more particularly to an integrated electrical switching circuit for use in transmission equipment for high bitrate applications.

BACKGROUND OF THE INVENTION

While today's telecommunication transmission networks rely mainly on optical transmission, internal signal processing in the network elements of a transmission network is still electrical in most cases.

The recent definition of the multiplexing principles and bitrates of an Optical Transport Network (ITU-T G.709) introduces a three level hierarchy with bitrates of 2.7 Gbit/s, 10.7 Gbit/s and 43 Gbit/s. Therefore, equipment is required for electrically processing these high bitrate signals. In particular, a need exists for an optical crossconnect for establishing cross-connections in an optical transport network. An optical crossconnect is a kind of switch with a huge number of I/O ports allowing to establish connections from any to any of these 110 ports. Internally, most optical crossconnects operate electrically, as all-optical switching still provides a number of drawbacks and envolves certain system limitations. An optical crossconnect, internally operating electrically, has thus to switch a number of asynchronous electrical signals at different bitrates from any input to any output port. This requires high speed integrated electrical switching circuits in order to form large integrated electrical switching matrices.

Generally, CMOS technology is preferred today for integrated circuits, but is not suited for high bitrate applications above 2 Gbit/s. On the other hand, bipolar integrated circuits based on SiGe technology would in principle be suitable for applications of up to 20 Gbit/s but have high power consumption. Typically, bipolar integrated circuits typically operate at an operating voltage of 5V. In particular, each circuit element (e.g., switch, multiplexer or the like) in a bipolar circuit has two truncs. When the circuit element is in operation, a constant current is switched from one trunc to the other. Since the constant current always runs through one of the truncs, such bipolar circuits have a high power consumption and great heat dissipation, which makes them unattractive for large switching matrices designed for high bitrate applications.

It is therefore an object of the present invention to provide a basic switching circuit suitable for high bitrate applications of 10 Gbit/s or more, and which does not suffer from the aforementioned drawbacks of existing integrated circuits.

SUMMARY OF THE INVENTION

These and other objects that appear below are achieved by a switching circuit according to claim 1.

In particular, the switching circuit combines CMOS and bipolar techinque on SiGe basis and operates at a low operating voltage of only slightly more than 2V. To achieve this low operating voltage, switching operation of the circuit is effected by switching a constant current source of the circuit on or off using MOS transistors. In addition, the constant current source is implemented using a MOS transistor rather than a bipolar transistor, which basically acts as a controllable resistor. Moreover, the logical levels of the output signal are accurately controlled using a constant current source that is controlled by an operational amplifier and a resistor voltage divider at the output to pull the voltage level down by an amount that corresponds to the logical levels.

The invention has the advantage of a very low operating voltage and associated thereto a very low power dissipation. For instance, a 33×33 square switching matrix contructed of such basic switching circuits according to the invention has a power consumption of approximately 8 W, only. Therefore, less intensive cooling of the integrated circuit is necessary. Moreover, the invention allows to switch electrical signals operating at a bitrate of up to about 20 Gbit/s.

BRIEF DESCRIPTION OF THE DRAWINGS

Preferred embodiments of the present invention will now be described with reference to the accompanying drawings in which.

DETAILED DESCRIPTION OF THE INVENTION

Generally, each circuit element of a bipolar integrated circuit has two truncs, where in operation a constant current is switched from one trunc to the other. Since the constant current always flows through one of the two truncs, the only way to reduce power consumption is to decrease the operating voltage of the circuit. Each bipolar transistor in a circuit typically requires a minimum voltage of 0.9V for well defined operation. For SiGe bipolar transistors, the minimum voltage can be reduced to about 0.8V. Each bipolar transistors thus introduces a voltage drop of 0.8V.

Known bipolar circuits have at least three cascaded transistors. This sums up to a total voltage of at least 3.1V, i.e., 3×0.9V+400 mV (+/−200 mV) for the logic level. In addition, a fourth cascaded transistor is typically required for a clock or a signal input. This sums up to the typical operating voltage of 5V. However, in order to achieve lower operating voltage, the invention reduces the number of cascaded bipolar transistors.

A first basic idea if the invention is thus, to implement a basic switching element as a simple buffer amplifier that is switched on or off. Switching of this buffer amplifier is effected by switching its power supply on or off.

Moreover, the invention makes use of the fact that the signal to be switched operates at the high bitrate of 10 Gbit/s and more, while the switching operation as such can be much slower. Therefore, the invention uses slower but low loss metal oxide semiconductor (MOS) field effect transistors to switch the power supply.

Another basic idea of the invention is to reduce the voltage of the output signal to a minimum by accurately controlling the current that flows through either of the two truncs of the bipolar circuit. Therefore, the current source is controlled by an operational amplifier, that receives at its input a very accurate reference voltage. In the embodiment, the reference voltage comes from a well defined bandgap in the semiconductor integrated circuit.

The accurate control allows to use instead of an output bipolar transistor a resistor voltage devider to shift the output voltage level by an amount corresponding to the logical levels. In the embodiment, the logical levels are chosen to be only +/−100 mV, i.e., 200 mV in total.

Figure 1:
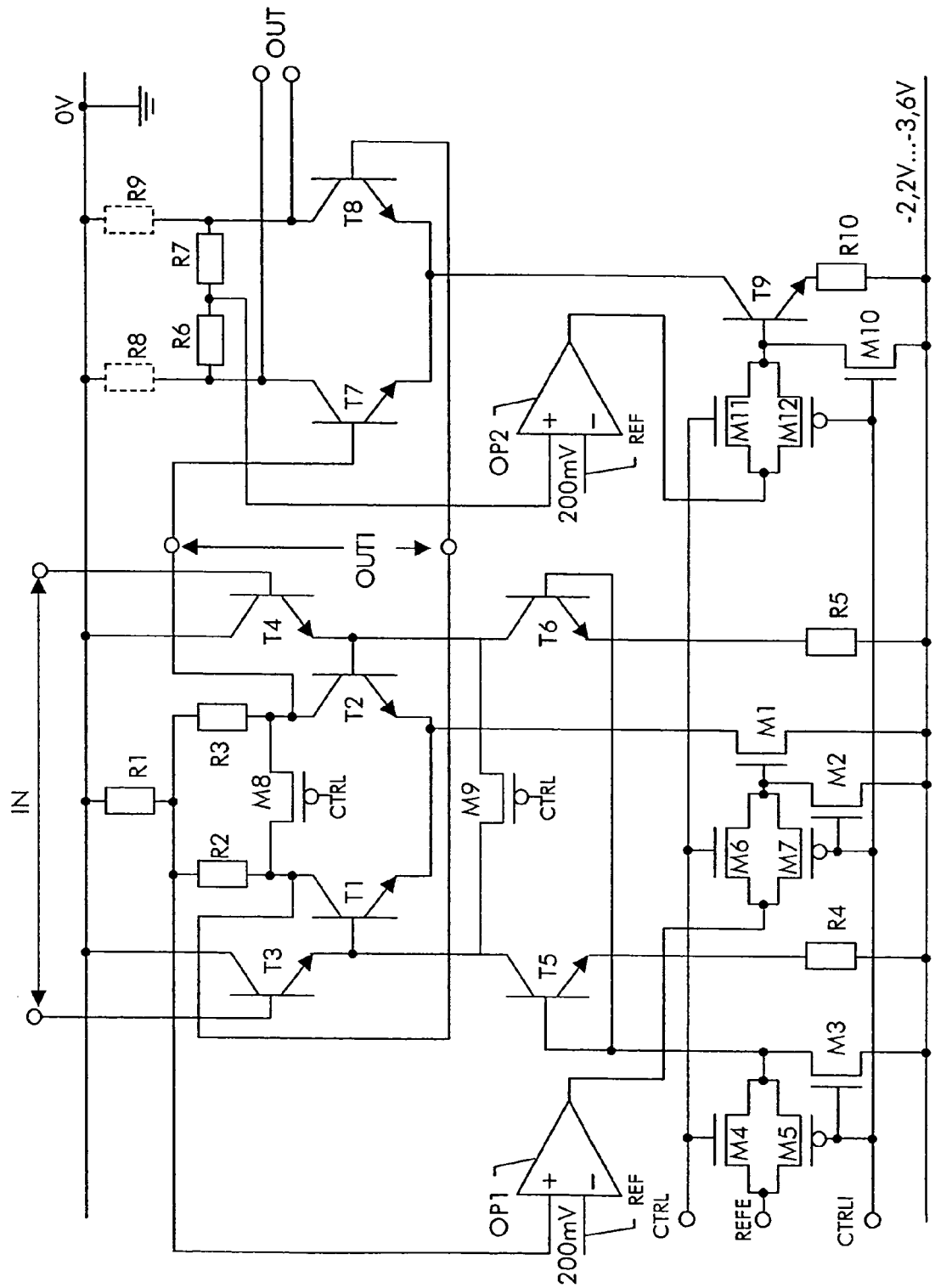
FIG. 1 shows a circuit diagram of the basic switching circuit according to the invention.

An embodiment of a basic switching circuit according to the invention is shown in figure 1. The circuit has two symmetrical bipolar branches, a first branch leading via transistors T3 and T1 and a second branch leading via transistors T4 and T2. The two inputs of a bipolar input signal IN are connected to the base of transistors T3 and T4, respectively. The emitter of T3 is connected to the base of T1; the emitter of T4 is connected to the base of T2. The collectors of T3 and T4 are connected to 0V (ground). The collector of T1 is connected via a first resistor voltage divider R2, R1 to 0V and the collector of T2 is connected via a second resistor voltage divider R3, R1 to 0V. The emitters of T1 and T2 are both connected to the drain of a MOS transistor M1 (metal oxide semiconductor), which source is coupled to a negative voltage power supply, which can be operated between −2,2V and −3,6V. The gate of M1 is controlled by the output of an operational amplifier OP1, which positive input is connected to the coupling point between R2, R3 and R1. Its negative input is coupled to a 200 mV reference voltage that comes out of a semiconductor bandgap. OP1 thus controls via M1 the current that flows through the resistor voltage divider by comparing the voltage drop at resistor R2 and R3 with the reference voltage REF.

The emitter of transistor T3 is further coupled via the collector-emitter junction of a transistor T5 and via a resistor R4 to the negative power supply and the emitter of transistor T3 is coupled via the collector-emitter junction of a transistor T6 and via a resistor R5 to the negative power supply. During operation of the switching circuit, the base of T5 and T6 is coupled to a reference voltage REFE. T5 and T6 define the current through T3 and T4, respectively, and thereby the voltage at the base of T1 and T2.

The voltage between the collectors of T1 and T2 is the output signal OUT1 of a first stage of the circuit. This first stage output OUT1 is coupled to a second stage. In particular, the collector of T2 is coupled to the base of a transistor T7 and the collector of TI is coupled to the base of a transistor T8. The collector of T7 is connected via a resistor R8 to 0V and the collector of T8 is coupled via a resistor R9 to 0V. The emitters of T7 and T8 are both connected to the collector of a transistor T9, which emitter is connected via a resistor R10 to the negative voltage power supply (−2.2V . . . −3.6V). The base of T9 is connected to the output of a second operational amplifier OP2, which negative input is coupled to the same 200 mV reference voltage as OP1. Its positive input is coupled to a high-value resistor voltage divider R6, R7 between the collectors of T7 and T8. The voltage difference between the collectors of T7 and T8 is the bipolar output signal OUT of the circuit. The signal output OUT is an open collector output of the current mode logic type (CML).

MOS transistor M1 controlled by OP1 acts as constant current source for the first stage. Bipolar transistor T9 controlled by OP2 acts as constant current source of the second stage.

As explained above, a basic idea of the present invention is to achieve switching from input IN to output OUT by activating or deactivating the constant current source under the control of a control signal CTRL. In particular, the switching circuit in the preferred embodiment uses a control signal CTRL and an inverted control signal CTRLI. Three MOS transistors serve to deactivate a constant current source. Two parallel MOS transistors M6, M7 connect the output or OP1 to the gate of the constant current supply MOSFET M1. The gate of M6 is controlled by the control signal CTRL. The inverted gate of MOS transistor M7 is connected to the inverted control signal CTRLI. The inverted control signal CTRLI serves further to short gate and source of M1 and thus deactivate M1 when the switching circuit is switched off. If the control signal is on and consequently the inverted control signal is off, M6 and M7 are both conducting and connect the output of OP1 to the gate of M1. M2 is blocking in this case and M1 supplies the two switching branches T3, T1 and T4, T2 with a constant current. Conversely, if the control signal is off and the inverted control signal is on, M6 and M7 are both blocking and disconnect the output of OP1 from the gate of M1, while M2 shorts the gate and source of M1, which thus is blocking and disables the entire switching circuit.

The same applies to the second stage, where T9, which acts as constant current supply in the second stage, can be disconnected from OP2 by MOS transistors M11 and M12 and its base be pulled to negative voltage level by M10.

In addition, the base leads of the two transistors T5 and T6, which define the current through input transistors T3 and T4, respectively, are disconnected from the reference voltage REFE by MOS transistors M4 and M5, and pulled to negative voltage level via MOS transistor M3, under the control of the same control signals CTRL and CTRLI.

As a further measure to decrease crosstalk when the switching circuit is deactivated, a MOS transistor M8 is connected between the collectors of T3 and T4 and a further MOS transistor is connected between the base of T3 and the base of T4. Both MOS transistors M8 and M9 have inverted gates and are controlled by control signal CTRL to short the base contacts of T1 and T2 and their collector contacts, as well, when the switching circuit is switched off.

The resistors in the circuit have the following values: R1, R2, R3, R8 and R9 have 150 Ω; R4 and R5 have 200 Ω; R6 and R7 have 10 kΩ; and R10 is 112 Ω.

Figure 2:
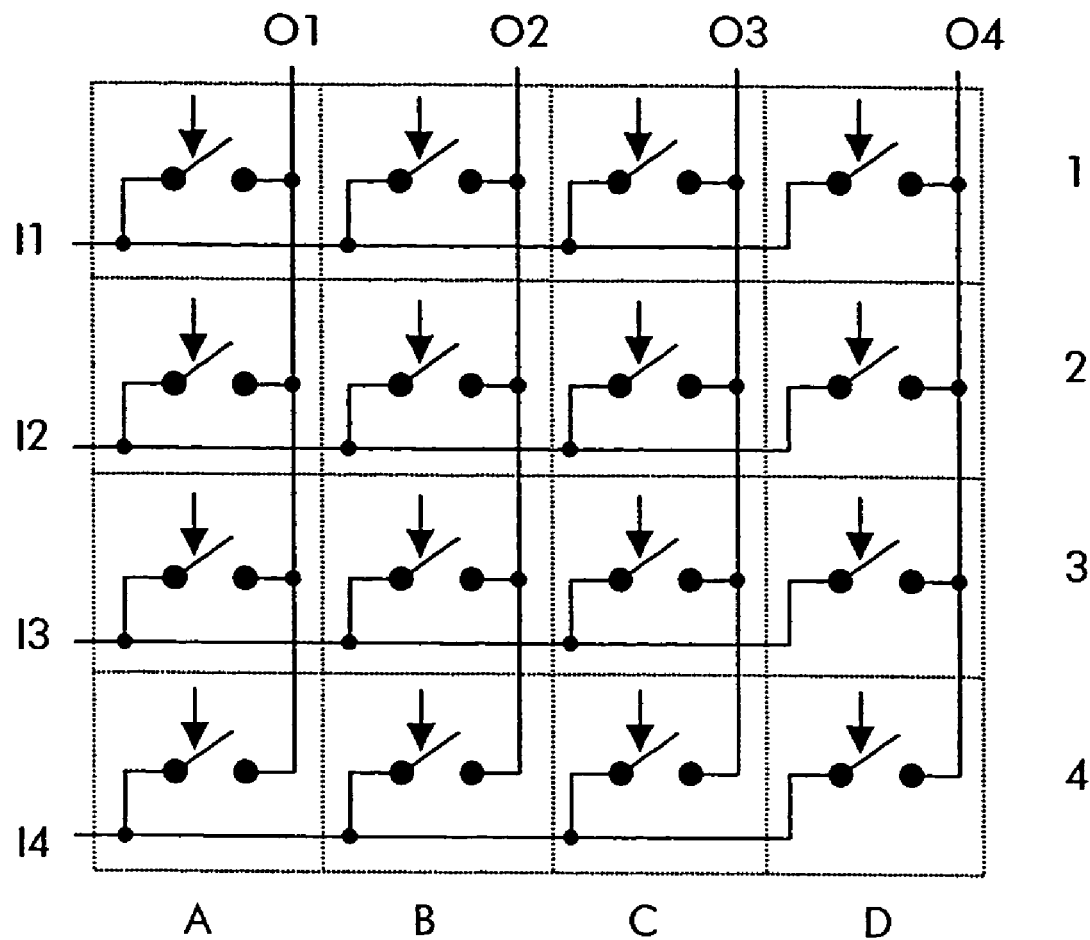
FIG. 2 shows a 16 switching circuits cascaded to form a square 4×4 switch.

Resistors R8 and R9 are shown with broken lines. The reason is that these resistors are shared among a number of switching circuits. In practice 16 basic switching circuits are coupled to form a 4×4 switch as shown in FIG. 2. All these 16 basic switching circuits share the same single resistors R8 and R9.

It is to be noted that in principle, the second stage of the circuit can be omitted. However, this second stage serves in the preferred embodiment to reduce total crosstalk to less than −36 dB, which is more an analogue rather than an digital requirement. In addition to reduced crosstalk, the use of a second stage has a further advantages. First, it serves to increase the low output voltage (200 mV) of the first stage, and second, it improves high frequency signal properties. In particular, as explained above, in the first stage the constant current supply is realized with a MOS transistor (M1), in order to reduce the number of cascaded bipolar transistors and thus allow lower operating voltage. However, a MOS transistor has worse high frequency characteristics than a bipolar transistor. The MOS current supply in the first stage causes thus some signal degradation of the output signal OUT1. On the other hand, the second stage requires only one bipolar transistor (T7, T8) in the signal path and the remaining operating voltage is thus sufficiently high to allow a realization of the constant current supply in the second stage with a superior bipolar transistor (T9) rather than a MOS transistor as in the first stage. The second stage thus compensates some impairments caused by the compromise of the MOS current supply that was necessary in the first stage.

Figure 3:
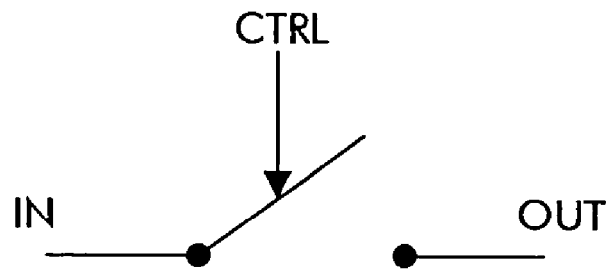
FIG. 3 shows a conceptual equivalent circuit of the basic switching circuit.

FIG. 2 shows how the basic switching circuit according to the invention can be cascaded to form a larger switching matrix. The conceptual equivalent circuit of the basic switching circuit is a simple on/off switch controlled by the control signal CTRL as shown in FIG. 3. The basic switches in FIG. 2 are arranged as a square matrix of four columns by four rows. Columns and rows are denoted in FIG. 2 similar to a chess board from A to D and from 1 to 4. All switches in one row 1–4 have their inputs connected to one common input 11–14 and all switches in one column A–D have their outputs connected to one common output O1–O4. This way, each input can be connected to each output via only one basic switch. For example, in order to connect input 13 to output O4, switch D3 must be closed. Obviously, an input can also be connected to more than one output to switch a broadcast.

In a preferred improvement, use is made of the fact that only one of the crosspoints per output (i.e., per column) can be activated. As a consequence of this, the constant current sources of all crosspoint switches in one column are controlled by a single pair of operational amplifiers OP1, OP2 from FIG. 1.

The basic switching circuit of the present invention is particularly suited for use in a switching matrix as described in co-pending European patent application entitled "Electrical Space Switching Matrix" by the same inventor and filed on the same day, which contents is incorporated by reference herein.

Having described the invention in a preferred embodiment, it would be apparent to those skilled in the art, that the invention is not restricted to implementation details and particular figures given in the embodiment.

Conversely, those skilled in the art would appreciate that several changes, substitutions and alterations can be made without departing from the concepts and spirit of the invention.

What is claimed is:

1. A switching circuit for controllably switching a high-bitrate bipolar input signal from an input to an output, said circuit comprising:
   a constant current source comprising a first metal oxide semiconductor field effect transistor;
   first and second emitter-coupled bipolar transistors transferring the input signal from said input to said output, emitters of said first and second transistors being coupled to a drain of said first metal oxide semiconductor field effect transistor of said constant current source;
   at least a second metal oxide semiconductor field effect transistor for activating or deactivating said constant current source under the control of at least one control signal; and
   a resistor voltage divider circuit coupled to collectors of said first and second bipolar transistors, the constant current source being accurately controlled by a voltage difference between a potential drop at the resistor voltage divider circuit and a constant reference voltage, whereby the resistor voltage divider circuit defines a potential of logical levels in the output signal.

2. A switching circuit according to claim 1, wherein said first metal oxide semiconductor field effect transistor is gate controlled by a first operational amplifier having a non-inverted input coupled to said resistor voltage divider and an inverted input coupled to said constant reference voltage.

3. A switching circuit according to claim 1, further comprising third and fourth bipolar transistors coupled between said input and the base of said first and second bipolar transistors, respectively, thus forming emitter followers between said input and said output.

4. A switching circuit according to claim 2, wherein said first and second bipolar transistors form a first stage circuit, said switching circuit further comprising a second stage circuit comprising fifth and sixth emitter-coupled bipolar transistors connecting an output of said first stage to said output of said circuit, said fifth and sixth bipolar transistors being coupled to a second constant current source.

5. A switching circuit according to claim 4, wherein said second constant current source comprises a seventh bipolar transistor having a base coupled to a second operational amplifier.

6. A switching circuit according to claim 1, further comprising at least a third metal oxide semiconductor field effect transistor coupled to said first and second bipolar transistors for increasing crosstalk when the switching circuit is deactivated.

7. A switching circuit according to claim 1, wherein said bipolar transistors are made of compound silicon-germanium semiconductor material.

8. A switching circuit according to claim 5, wherein said first and second operational amplifiers are shared with other switching circuits in a switching matrix.

9. A switching circuit according to claim 1, wherein a source of said first metal oxide semiconductor field effect transistor is coupled to a negative voltage power supply.

10. A switching circuit for controllably switching a high-bitrate bipolar input signal from an input to an output, said circuit comprising:
    a constant current source comprising a first metal oxide semiconductor field effect transistor;
    first and second emitter-coupled bipolar transistors transferring the input signal from said input to said output, said first and second transistors being coupled to said constant current source;
    at least a second metal oxide semiconductor field effect transistor coupled to a gate of said first metal oxide semiconductor field effect transistor for activating or deactivating said constant current source under the control of at least one control signal; and
    a resistor voltage divider circuit coupled to collectors of said first and second bipolar transistors, the constant current source being accurately controlled by a voltage difference between a potential drop at the resistor voltage divider circuit and a constant reference voltage, whereby the resistor voltage divider circuit defines a potential of logical levels in the output signal.

11. A switching circuit according to claim 10, wherein said first metal oxide semiconductor field effect transistor is gate controlled by a first operational amplifier having a non-inverted input coupled to said resistor voltage divider and an inverted input coupled to said constant reference voltage.

12. A switching circuit according to claim 10, further comprising third and fourth bipolar transistors coupled between said input and the base of said first and second bipolar transistors, respectively, thus forming emitter followers between said input and said output.

13. A switching circuit according to claim 11, wherein said first and second bipolar transistors form a first stage circuit, said switching circuit further comprising a second stage circuit comprising fifth and sixth emitter-coupled bipolar transistors connecting an output of said first stage to said output of said circuit, said fifth and sixth bipolar transistors being coupled to a second constant current source.

14. A switching circuit according to claim 13, wherein said second constant current source comprises a seventh bipolar transistor having a base coupled to a second operational amplifier.

15. A switching circuit according to claim 10, further comprising at least one a third metal oxide semiconductor field effect transistor coupled to said first and second bipolar transistors for increasing crosstalk when the switching circuit is deactivated.

16. A switching circuit according to claim 10, wherein said bipolar transistors are made of compound silicon-germanium semiconductor material.

17. A switching circuit according to claim 14, wherein said first and second operational amplifiers are shared with other switching circuits in a switching matrix.

18. A switching circuit according to claim 10, wherein a source of said first metal oxide semiconductor field effect transistor is coupled to a negative voltage power supply.

* * * * *